United States Patent [19]

Booth et al.

[11] 4,397,385

[45] Aug. 9, 1983

[54] CENTERING ARTICLES

[75] Inventors: Raymond H. Booth, Walnutport; Jack J. Monahan, Allentown; Fred J. Schneider, Northampton, all of Pa.

[73] Assignee: Western Electric Co., Inc., New York, N.Y.

[21] Appl. No.: 225,562

[22] Filed: Jan. 16, 1981

[51] Int. Cl.³ ............................................. B65G 15/64
[52] U.S. Cl. .................................................. 198/345
[58] Field of Search ............... 198/345, 344, 394, 395, 198/434

[56] References Cited

U.S. PATENT DOCUMENTS

| 3,441,121 | 4/1969 | Pastuszak | 198/394 X |
| 3,946,931 | 3/1976 | Bahnck et al. | 228/102 |
| 4,069,924 | 1/1978 | McCorkle | 414/752 |

*Primary Examiner*—Jeffrey V. Nase
*Assistant Examiner*—D. Williamson

*Attorney, Agent, or Firm*—W. O. Schellin

[57] ABSTRACT

Articles (12) are loaded onto a movable article holder such as pedestals (18) mounted to a rotary table (20). The table is indexed to advance the articles (12) first to a centering station (41) and then to a work station (49) which may be, for example, a lead frame bonder. At the centering station (41) a typical centering mechanism (22) urges the articles to a predetermined center location. While the centering mechanism may be adjusted to and fixedly located in a position to center the articles (12) to a theoretical center removed by precisely one step or a multiple thereof from the bonding position, the centering station (41) provides for tangentially shifting the theoretical center with respect to the table (20). Any shift of said theoretical center is made to offset an anticipated error of alignment of the articles, even though such error may be unique to each of the pedestal positions.

5 Claims, 5 Drawing Figures

CENTERING ARTICLES

TECHNICAL FIELD

This invention relates to centering articles. In particular, the invention relates to centering articles with respect to a reference location and advancing the centered articles to a work station. The invention has been found to be particularly advantageous in centering articles located on a rotary table, where the articles are then advanced by an indexing movement of the table from the centering station to a subsequent work station.

BACKGROUND OF THE INVENTION

In the electronics industry, various operations of mounting and packaging semiconductor chips, such as lead frame bonding operations, are typically sequential in nature. In exemplary apparatus for bonding a ceramic substrate to respective lead terminations at a center of a lead frame, substrates are loaded in sequence onto pedestals on a rotary table and are advanced to a bonding station at which they move into vertical alignment with a corresponding frame of a strip of lead frames to become bonded thereto. The strip itself is incrementally advanced tangentially to the table as the table indexes a new substrate into position.

To achieve alignment repeatedly at the bonding station between the substrates and the respective lead frames a centering station is preferably positioned in prior art apparatus between the position of the table at which the substrates are loaded onto the pedestals and the position at which the substrates are bonded to the respective lead frames. At the centering station the substrates are aligned in reference to a fixed frame of the apparatus. Since the strip of lead frames in incrementally advanced relative to the same fixed frame of the apparatus, an alignment of the substrates with respect to the lead frames appears to be achievable by centering the substrates with respect to the frame.

However, a tendency toward misalignment between the substrates and the respective lead frames has been noted in such prior art lead frame bonding apparatus. The misalignment appears to vary as different pedestals are moved into alignment with the strip. In worst case misalignment conditions, unacceptable bonds between the substrates and the respective lead frames result. It is, therefore, desirable to align the substrates more precisely with respect to the lead frames.

SUMMARY OF THE INVENTION

In accordance with the invention, an article handling apparatus includes a mechanism for centering articles on preselected centers with respect to a base of the apparatus. The position of each of the centers is alterable in accordance with a predetermined pattern. The pattern for altering the centers, according to one embodiment of the invention, is chosen to offset predetermined errors in alignment, when the substrates are advanced after being centered to a work station.

BRIEF DESCRIPTION OF THE DRAWING

Various features and advantages of the present invention will become apparent from the detailed description when read in reference to the accompanying drawing, wherein.

DETAILED DESCRIPTION

The Apparatus in General

Figure 1:
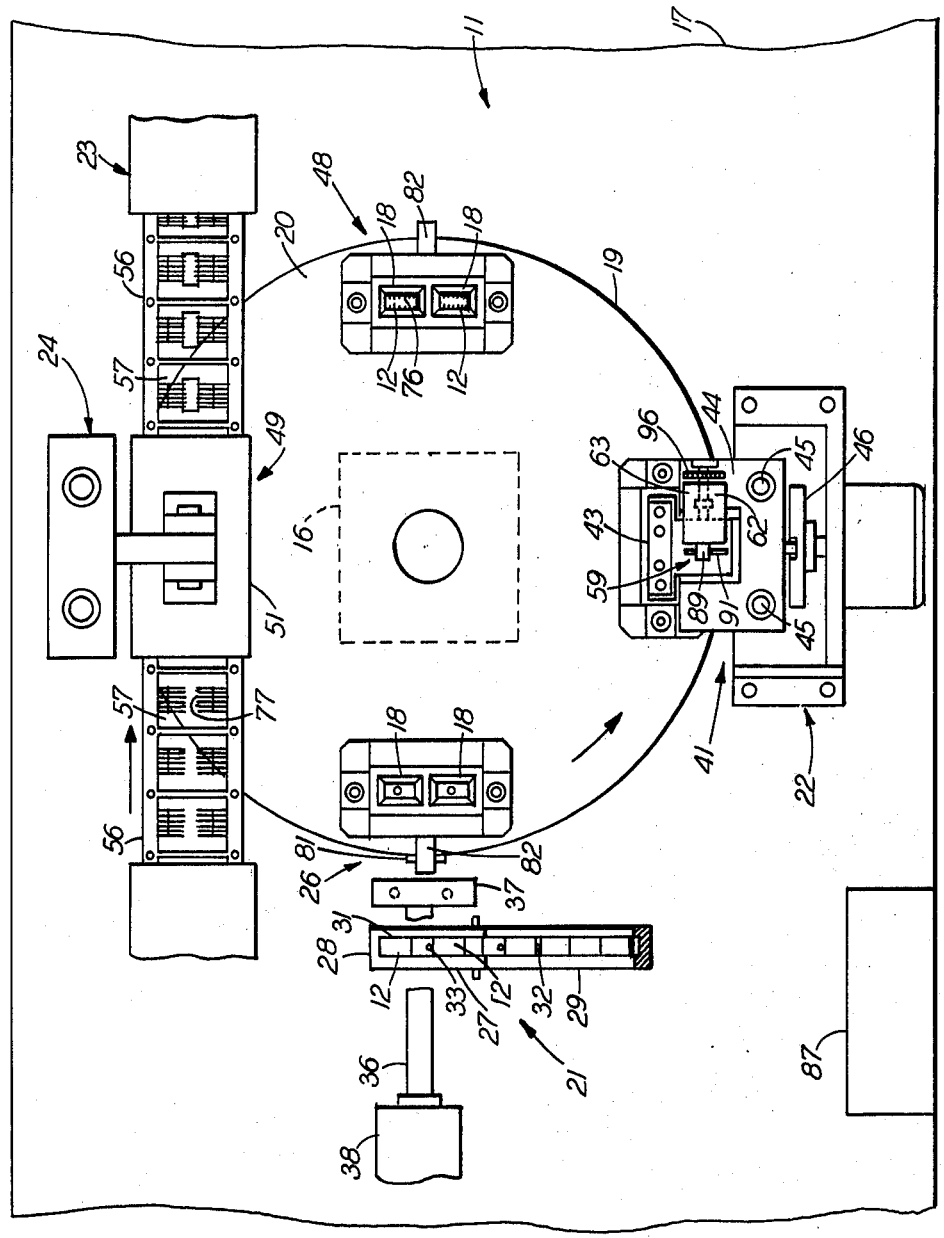
FIG. 1 is a top view of an apparatus with respect to which the present invention is described.

FIG. 1 depicts a lead frame bonding apparatus, designated generally by the numeral 11, which is a preferred embodiment of this invention. Using a known technique for sequentially feeding articles, such as ceramic electronic substrates 12, the apparatus 11 employs a typical rotary index mechanism 16. The index mechanism is typically mounted in a central location to a fixed frame or base 17 of the apparatus 11.

A convenient number of article holders or pedestals 18 are evenly spaced on a rim 19 of a rotary table 20 of the mechanism 16. The indexing movement of the mechanism 16 corresponds, of course, to the number of positions of the pedestals 18 such that, as the mechanism 16 rotates the table 20 in an indexing, start-stop movement, the pedestals 18 cycle in sequence through a chosen number of positions. In the preferred apparatus 11, the table 20 has four pedestal positions. At each position, two pedestals 18 are mounted adjacent to one another in the direction of travel, such that during each operation, the mechanism 16 rotates the table 20 through a corresponding 90°.

Working in cooperation with the index mechanism 16 and also mounted to the base 17 about the index mechanism 16 are a substrate load mechanism 21, a centering mechanism 22, a lead frame feed mechanism 23 and a bonder 24. The substrate load mechanism 21 may be constructed in any of a number of ways. In the described embodiment, as already discussed, it is preferred to load two substrates 12 simultaneously onto the table 20 at each of the four index positions at a load station 26. The load station 26 is also referred to as the first index position of the table 20. The load mechanism 21 is a typical prior art load mechanism which operates similar to one described in U.S. Pat. No. 3,946,931 to Bahnck et al. However, a dual escapement mechanism 27 at a lower end 28 of a sloped feed track 29 permits two of the substrates 12 to be placed simultaneously into position on the respective pedestals 18 at each of the four index positions of the table 20.

During each load cycle, a first substrate 12 is moved into a first position 31 while the subsequent substrates 12 are restrained by typical blocking tabs 32 moving into contact with the lowermost substrates 12 in the track 29. Thereafter, a stop lug 33 is raised in the lower end 28 of the track 29 to designate a second stop position for a second one of the substrates 12. Such second substrate 12 is released and advances to the stop lug 33. Thereafter, the lower end 28 of the track is pivoted from the sloped orientation into a horizontal position. A load arm 36 of the mechanism 21 has dual vacuum pickup tips 37 such that when a typical linear actuator, for example an air cylinder 38 is operated, both such first and second substrates 12 are loaded onto the respective pedestals 18 simultaneously. The described load operation is repeated for each indexing operation of the index mechanism 16. Thus, when the pedestals 18 advance to their next position 90° past the load station 26, the two substrates on the respective pedestals 18 are moved into gross alignment with the centering mechanism 22 at a centering station 41.

Figure 3:
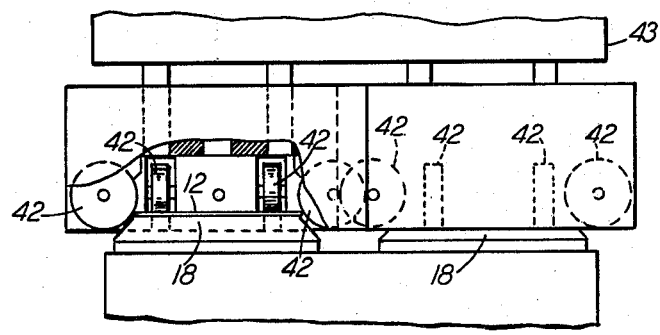
FIG. 3 is a detailed view of a preferred alignment mechanism, showing a plurality of rollers for engaging the substrates on two adjacent pedestals at the centering station shown in FIG. 2.

Referring to FIG. 3, the centering mechanism precisely centers the substrates 12 according to a technique by which sloped surfaces of mechanical elements such as rollers 42 engage the edges of the substrates 12 through a vertical motion toward the substrates 12. Such engagement urges the substrates 12 laterally with respect to their pedestals 18 until the respective substrates have taken up a centered position between a pair of spaced rollers 42. While other mechanical structures having sloped surfaces may be used to center the substrates 12, the arrangement of the rollers 42 was found to be most beneficial to minimize abrasive wear on the centering surfaces due to the engagement with the ceramic material of the substrates. In the present embodiment, two adjacent axially offset rollers 42 are fitted into the space between the two adjacent pedestals 18 at each of the index positions of the table 20. One of such offset rollers 42 engages the respective edge of the one substrate 12 while the second roller 42 engages the facing edge of the other substrate. The advantages and functions of the rollers 42 are also described in U.S. Pat. No. 4,069,924 to McCorkle. For purposes of supplementing the above description of the centering action of the substrates 12 itself, the McCorkle patent is incorporated by reference herein.

Figure 2:
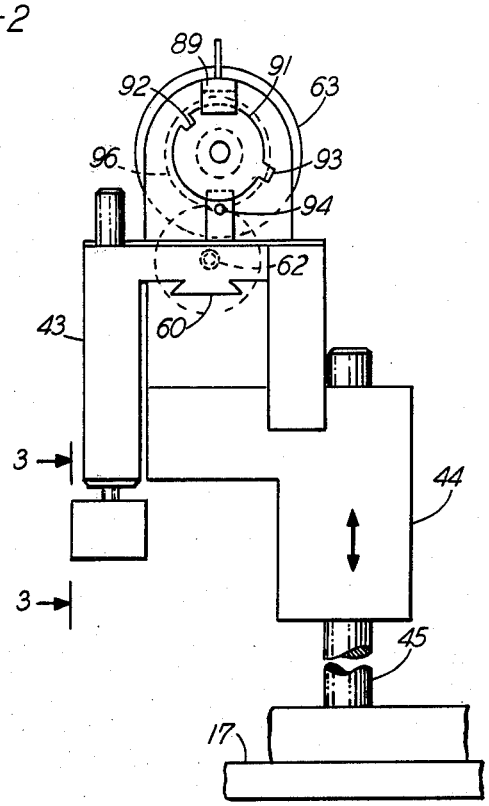
FIG. 2 shows in greater detail an article centering station of the apparatus of FIG. 1, including features of the present invention.

In distinction over the disclosure of the McCorkle patent, the present centering mechanism 22 includes two adjacent clusters of six of the rollers 42 to simultaneously center both of the substrates 12. All of the rollers 42 are mounted to a common support structure 43, referred to as a centering head, and, of course, the inner rollers 42 are adjacent to each other, but axially viewed in overlapping relationship to conserve space. The centering head 43 is, in turn, mounted to a reciprocatably movable support 44 guided on vertical guide rods 45 as shown in FIGS. 1 and 2. The vertical movement may be generated by any one of a number of vertical actuator mechanisms, such as a preferred cam drive 46 or an air pressure or vacuum cylinder.

After being centered at the centering station 41, two further indexing operations by the index mechanism 16 advance the substrates 12 first to a typically vacant station 48 and then to a bonding station 49 and into alignment with a dual bonding head 51 of the bonder 24. At the bonding station 49 a strip 56 of lead frames 57 is fed in a direction tangential to the motion of the pedestals 18 into overlapping relationship with two of the substrates 12 when they have advanced to the bonding station 49. The lead frames 57 also advance incrementally in steps of two lead frames 57 at a time to correspond to the indexing movement of the pedestals 18. Thus, each time two of the substrates are advanced to the bonding station 49, two lead frames 57 move into alignment with the substrates.

In addition to the above described functions and elements of the apparatus 11 in general, the centering mechanism 22, in particular, includes a further alignment mechanism or aligner 59, the description of which and of its functions in aligning the substrates 12 with the lead frames 57 gives a better understanding of the improvements incorporated within the apparatus 11 as features of this invention.

The Alignment Mechanism

Referring again to FIG. 2, the guide rods 45 for the vertically reciprocating support 44 are mounted to the base 17, thus the movement of the support 44 is strictly vertical relative to the base 17. However, the support 44 features a track 60 to which the centering head 43 is movably mounted to also reciprocate tangentially to the circular path of the pedestals 18 and relative to the base 17. A micrometer-type helical drive lead screw 62 is coupled to a stepping motor 63, which is mounted to the vertically guided support 44, such that an operation of the stepping motor may alter the precise tangential position of the centering head 43.

It has namely been found that an initial accuracy of some commercially available index table mechanisms may change over the life of such mechanisms. Inaccuracies, also referred to as deviations from a desired aligned position of the substrates 12 at the bonding station 49, of recurring magnitudes were found to be attributable to certain ones of the pedestals 18. Such inaccuracies may also stem from the bonding procedures at the bonding station 49. At the bonding station 49, the pedestals 18 are elevated from the table 20 to a height which brings the top surfaces of the substrates 12 into contact with the lower surfaces of the lead frames 57. While sliding clearances of the pedestals 18 in the table 20 are tightly controlled, small inclinations from the vertical orientation of guide passages through the table 20 might account for such deviations. Thus, as certain ones of the pedestals index from the bonding station 49 to the load station 26 and from there past the centering station 41 back to the bonding station 49, the deviations of the centered substrates 12 from a desired position in the tangential direction were found to be substantially the same as the deviations of previous substrates 12 on the same pedestals 18, while such deviations differed from deviations of substrates 12 located on pedestals 18 of the other index positions of the table 20.

Consistent with maximum observed tangential deviations of the substrates 12, the maximum tangential excursion of the centering head 43 is limited to an overall adjustment of about 0.55 mm, whereby each index step of the preferred stepping motor 63 of 7.5° corresponds to a tangential adjustment of substantially 0.0125 mm. These dimensions, of course, are a matter of choice and may be altered to suit particular requirements by appropriate gearing or changes in the pitch of the lead screw 62. However, the comparatively small increments of the adjustment steps also illustrate the degree of precision which is required for locating the substrates 12 with respect to the lead frames 57 at the bonding station 49.

Figure 4:
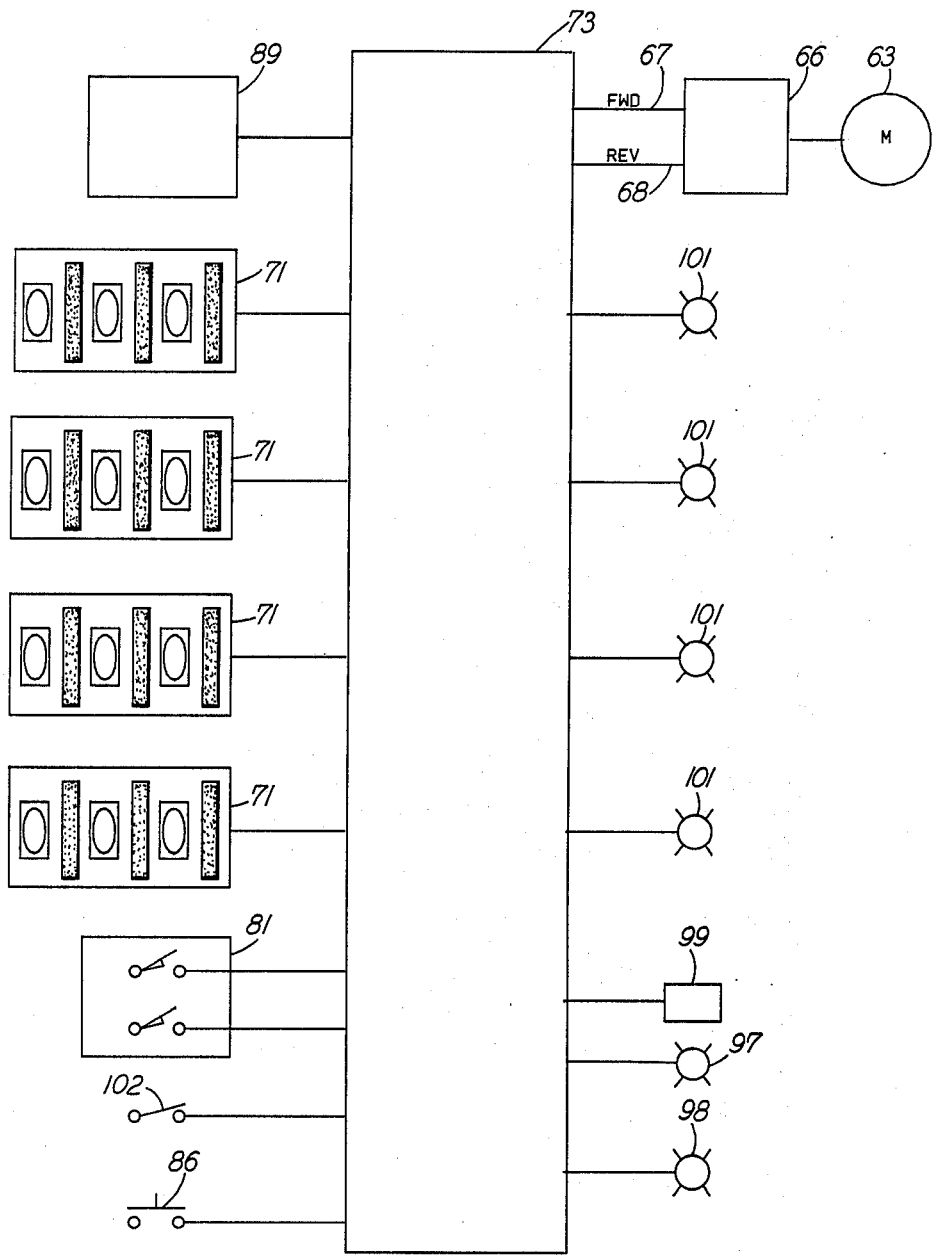
FIG. 4 shows a schematic diagram of a preferred control circuit for the alignment mechanism at the centering station in FIG. 2.

Referring to FIG. 4, the stepping motor 63 is typically controlled through a conventional motor control circuit 66. Such a motor control circuit 66 is typically available from manufacturers as a component part of or as an accessory to the motor 63. Electrical control pulses applied to a "Forward" input lead 67 or to a "Reverse" input lead 68 rotate the motor in one or the other direction.

According to a preferred embodiment of the invention, predetermined adjustment dimensions for each of the pedestals are dialed into and recorded in one of four rotary digital switches 71, which are commonly referred to as thumbwheels or thumbwheel switches. The adjustment dimensions are corrections of observed alignment errors in previously bonded circuits. The numbers in each one of the thumbwheels or thumbwheel switches 71 correspond to a desired distance of the centering rollers 42 from a given datum. The datum corresponds to the home position of the stepping motor 63.

Since the thumbwheel switches 71, which are preferably used in the described embodiment, provide for only positive input numbers as predetermined distances from the datum or home position of the motor 63, the centering mechanism 22 is in its entirety initially adjusted with respect to the base 17 to align the mean of all correction values to become centered on the respective lead frames 57 at the bonding station 49. Consequently, any deviation adjustments by the aligner 59 tend to lie on both sides of such mean, and the home position may ideally be offset to one side by one half of the total adjustment range.

As further shown in the schematic diagram of FIG. 4, the preferred embodiment of the invention advantageously manipulates the desired adjustment values stored in the thumbwheel switches through a microprocessor circuit 73. While such a microprocessor circuit in itself is a complex electronic device, its output functions are well understood by persons skilled in the art. The microprocessor circuit 73 is, in the preferred embodiment, a device commercially available from Intel Corporation under the designation 8080. It is typically mounted on a printed circuit card (not shown), powered by typical power supplies and operated by a clock circuit (not shown). Of interest to the description of the preferred embodiment are preferred control inputs and their desired outputs which are advantageously applied throughout the operation of the apparatus 11. It should be noted that it is customary in the art to isolate the microprocessor 73 from input devices through optical isolators. The function of such isolators which depend on an optical coupling are well known and they are not shown in the diagram of FIG. 4 even though their presence in the appropriate input and even output leads may be inferred.

As a result of the operation of the microprocessor circuit 73, the centering rollers 42 become positioned in the tangential direction of the table at each of the four index positions. In turn, the positions of the substrates 12 are shifted tangentially to position bonding pads 76 with inner lead terminations 77 of the lead frames 57 at the bonding station.

Control Functions and Processes

Figure 5:
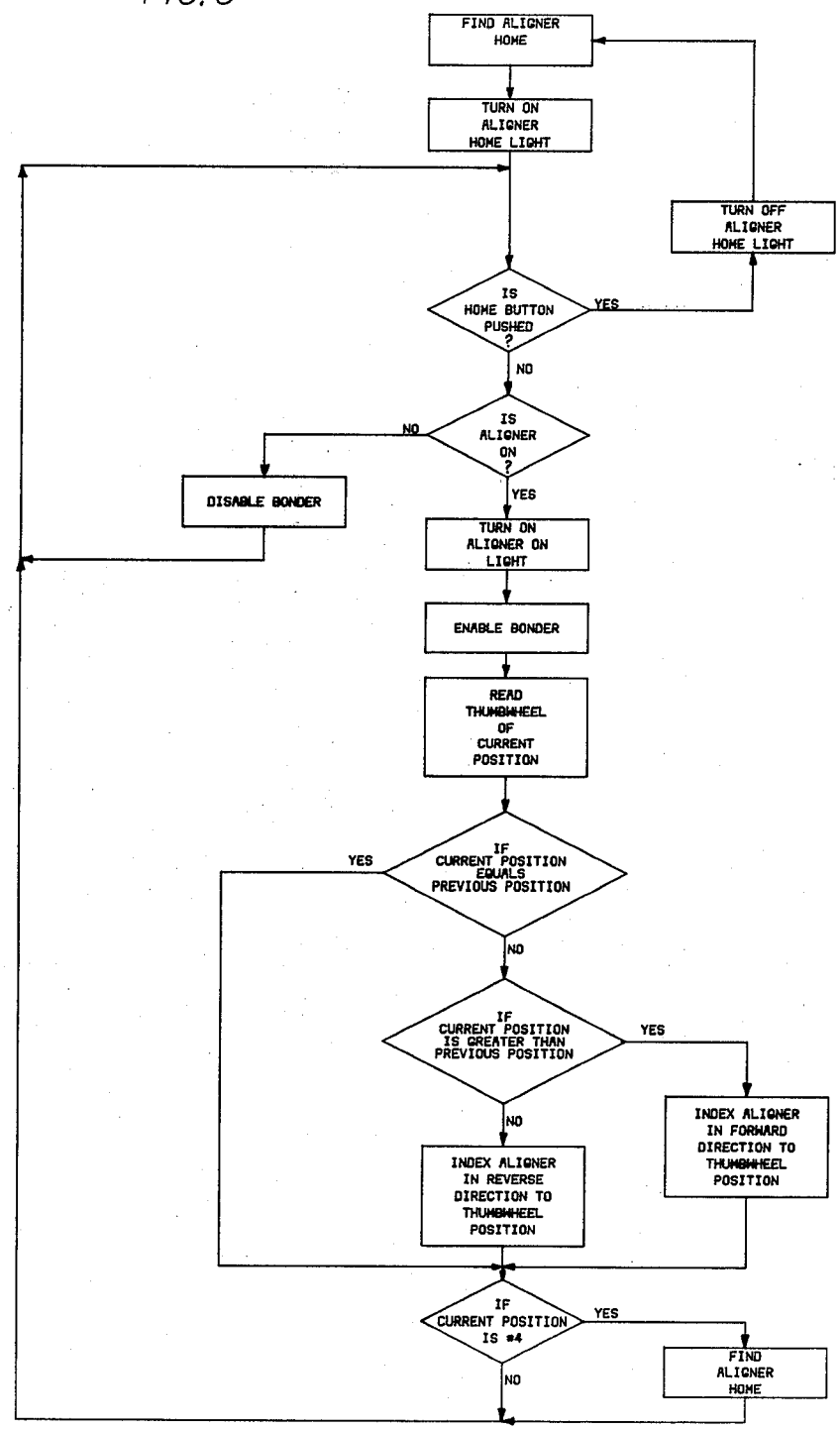
FIG. 5 is a flow chart diagram which illustrates a control sequence followed by a preferred circuit for controlling the position of a centering head as it is adjusted by the alignment mechanism.

A more detailed description of preferred control functions and processes is best given in reference to FIGS. 4 and 5. Beneath the table 20 of the apparatus 11, and shown in an exemplary position at the load station 26, a pair of indicator switches 81 are located. The switches are positioned to engage protrusions 82 (see FIG. 1) which are mounted to the table 20 at each of the four positions of the pedestals 18. The protrusions are shown in FIG. 1 in their top view showing their base from which the binary coded protrusions extend downward into the path of the switches 81. At a first pedestal position, no protrusions engage the switches 81. At the other three pedestal positions of the table, the protrusions 82 are shaped to activate one then the other and thereafter both of the switches 81 to indicate at any given stop position in binary form the precise orientation of the table 20. The protrusions consequently identify the four pedestal positions on the table 20 as positions one through four. The thumbwheel switches 71 are also identified by corresponding numerals. The adjustment data dialed into each of the thumbwheel switches 71 consequently are associated directly with a particular one of the group of pedestals 18.

In the operation of the apparatus 11, a desirable home position is obtained for the centering head 43 prior to starting repetitive bonding cycles. Returning the aligner 59 to the home position eliminates a danger of cumulative errors occurring because of the typically electrically noisy industrial environment. The desired alignment positions of each pedestal position will be found at some positive distance away from the home position. This is the distance which is numerically dialed into the thumbwheel switches. The following further illustrates how each of these alignments are individually set for each of the positions of the pedestals 18. Such a home position may be obtained at any position of the table 20 by pushing a home button 86, a pushbutton switch preferably mounted on a control panel 87 (FIG. 1) of the apparatus 11.

In response to a signal from the pushbutton 86, the motor 63 is activated to rotate in a clockwise direction (as viewed in FIG. 2) until a "home signal" is received by the microprocessor circuit 73.

The "home signal" is generated as an output signal from a photosensor 89 mounted to one end of the motor 63 (see FIG. 2). A disk 91 is mounted to an output shaft end of the motor 63. Normally, the disk 91 interrupts a light output from the photosensor 89 from being received by its sensor unit. However, when a cutout 92 in the disk 91 is rotated into alignment with the photosensor 89, the light output passes through the cutout and is received by the sensor to emit the electrical "home signal." To prevent the motor 63 from rotating through more than one complete turn, the disk 91 also has a tab 93 which would engage a stop 94 should the motor advance past the described home position. As shown in FIG. 2, the shaft of the motor 63 is preferably mounted spaced from a lead screw 62. Appropriate gears 96, the ratio of which may be changed to suit specific requirements, couple the rotational output from the motor 63 to the lead screw 62, as shown in FIG. 1.

An indicator light 97, referred to as "home light" is now turned on to indicate that the aligner 59 is in its home position. The microprocessor 73 now ascertains that the aligner 59 is actually turned on and in working condition. An "Aligner On" light 98 indicates such an operational condition.

The described embodiment features an interlock between the aligner 59 and other operational features of the apparatus 11 to disable the apparatus 11 or "bonder" at any time when the aligner 59 is not functional. To disable the apparatus 11, a signal output from the microprocessor circuit 73 which normally maintains a relay switch 99 closed, is removed to open the switch and remove power from the apparatus. It should be understood, however, that if so desired, such disable feature may be deleted. The disable feature merely ensures that the aligner 59 is actually powered up and operating during the operation of the apparatus 11.

While in operation, the microprocessor circuit 73 reiterates its operations, continuously running through its process loop, at a cycle time which is not tied to the operational cycle of the apparatus 11, but instead depends on the clock pulses of the microprocessor circuit 73. The cycle time of the microprocessor circuit 73 is not exactly known, but is estimated to lie in the range between 50 to 100 repetitions per second. Thus, for practical purposes, the microprocessor circuit maintains a continuous check on the apparatus 11 including the aligner 59.

As shown in FIG. 5, the thumbwheel switch 71 corresponding to the present position is read and compared to the previously read thumbwheel switch value. If a positive difference between the two values of thumbwheel switch 71 exists, the aligner 59 is indexed forward to its new position by applying an appropriate number of positive pulses to the forward lead 67 of the control circuit 66. If the present or current desired position as read from the thumbwheel switch is not greater than the previously read position, then the appropriate number of pulses are aplied to the reverse lead 68, and the motor 63 steps in the reverse direction to the new position closer to the home position. The presence of the microprocessor circuit in the preferred embodiment provides convenient monitoring functions. For example, as shown in FIG. 4, position indicator lights 101 indicate to an operator at any time which of the positions of the pedestals 18 is at the centering station 41.

As an additional precaution to ensure the correct alignment position of the aligner 59, once during each revolution of the table 20, the aligner is returned to its "home position." As shown in FIG. 5, the aligner is preferably returned to such home position after the substrates 12 on the fourth pedestal position have been centered. The completion of this operation may be signalled to the circuit 73 through, for example, an input signal through a switch 102.

From the above description, is should be realized readily that the invention is not restricted in its application to bonding electronic substrates to lead frames, but that other handling apparatus also may be improved by aligning articles on an individual basis to a known pattern, rather than to a common centerline, such that the articles may then be aligned to a common center after they advance to another work station.

It should also be realized that the process sequence shown in the functional diagram of FIG. 5 need not be executed by the microprocessor circuit 73 as it is done in the preferred embodiment. While the present microprocessor technology affords a special tool for decision making in response to certain inputs, standard electronic logic circuits, or such known elements as relays may be used to operate the aligner in the manner described herein. Various other changes and modifications may also be made without departing from the spirit and scope of this invention.

What is claimed is:

1. Apparatus for advancing a plurality of articles in sequence from a load station into an aligned position at a work station spaced from said load station, which comprises:

means for supporting the plurality of articles at spaced intervals, said supporting means including a plurality of article holders which are mounted on such supporting means at such spaced intervals;

means for indexing said article holders sequentially in at least two increments between such load station and said work station to advance said articles toward said aligned position at said work station in steps corresponding to said spaced intervals toward said aligned position at said work station with at least one intermediate index position, each of such article holders having a distinct, predetermined deviation from such aligned position at said work station and in a predetermined direction with respect to the movement of the article holders toward said work station;

means for adjusting the position of said articles located at such intermediate index position removed by at least one of the incremental steps corresponding to said spaced intervals from said aligned position at said work stations; and means for shifting the location of the article position adjusting means in a direction opposite to and by predetermined distances corresponding to said distinct, predetermined deviation of each such article holder from the aligned position at said work station.

2. Apparatus according to claim 1, wherein said supporting means is a rotary table, and the indexing means is a mechanism for advancing the table incrementally, said table including said article holders, said article holders being equally spaced on the table to advance sequentially into substantial alignment with predetermined index positions, said index positions including said load station, said intermediate index position at which such article position adjusting means is located, and said work station.

3. Apparatus according to claim 2, wherein said article position adjusting means includes a support having peripheral engagement surfaces movably mounted on such support to urge said articles toward an aligned position with respect to said support upon engagement with said surfaces, and wherein said shifting means is an aligner comprising:

means for movably mounting said peripheral engagement surfaces including such support to move in a direction tangentially to said table, said mounting means including a guide track for said support, a lead screw engaging said support and a stepping motor coupled to said lead screw for reciprocably moving said support along said guide track, and means for activating said motor for a predetermined number of steps to drive said support along said guide track for shifting the support with respect to the apparatus by a predetermined distance from such intermediate index position to correspond to the predetermined deviation of a respective one of the article holders.

4. Apparatus according to claim 3, wherein the articles are electronic substrates and the apparatus is a lead frame bonder for bonding said substrates to lead frames, said apparatus further including means for feeding said lead frames tangentially into alignment with said work station, said work station having support means for mounting a bonding head, wherein two substrates at a time are fed by the work holder into alignment with two adjacent lead frames at the work station, and the support of the article position adjusting means includes a plurality of rollers which are movably mounted such that cylindrical surfaces thereof are the peripheral engagement surfaces, and two rollers of adjacent substrate alignment positions are axially offset and laterally offset while maintaining overlapping projections to fit into the space between two adjacent substrates on the work holder.

5. A method of advancing articles from a load station into an aligned position at a work station spaced from said work station, said method comprising:

supporting the articles on article holders of an index feed mechanism at spaced intervals;

advancing said articles in steps corresponding to said spaced intervals into substantial alignment with said position at said work station;

centering said articles in reference to a support located in a position removed by at least one of said steps corresponding to said spaced intervals from said aligned position;

determining any misalignment of the positions of the articles at said work station with respect to a desired position of such articles at the work station associated with each of the article holders; and adjusting said support by predetermined distances corresponding to said misalignment of the respective articles from said aligned position to align the articles with the desired position at said work station upon such articles being advanced to said work station.

* * * * *